(12) United States Patent
Kim et al.

(10) Patent No.: US 12,376,439 B2
(45) Date of Patent: Jul. 29, 2025

(54) BACK-LIGHT UNIT HAVING LIGHT-EMITTING CHIPS AND DISPLAY APPARATUS HAVING THE SAME

(71) Applicant: LG Display Co., Ltd., Seoul (KR)

(72) Inventors: Nam Kook Kim, Paju-si (KR); Sung Woo Choi, Paju-si (KR); Seon Hui Hwang, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 316 days.

(21) Appl. No.: 18/091,356

(22) Filed: Dec. 29, 2022

(65) Prior Publication Data

US 2023/0216012 A1  Jul. 6, 2023

(30) Foreign Application Priority Data

Jan. 1, 2022 (KR) .......... 10-2022-0000003
Jan. 1, 2022 (KR) .......... 10-2022-0000004
Jun. 30, 2022 (KR) .......... 10-2022-0080655

(51) Int. Cl.
*H10H 20/00* (2025.01)
*G02F 1/13357* (2006.01)
(Continued)

(52) U.S. Cl.
CPC ..... *H10H 20/857* (2025.01); *G02F 1/133603* (2013.01); *G02F 1/133605* (2013.01); *G02F 1/133606* (2013.01); *H01L 25/0753* (2013.01)

(58) Field of Classification Search
CPC .......... H01L 25/0753; H10H 20/857
See application file for complete search history.

(56) References Cited

U.S. PATENT DOCUMENTS 10,475,876 B2 * 11/2019 Bower ............... H10K 59/129
2008/0014532 A1 * 1/2008 Kessel ............... H01L 21/6835
430/311
(Continued)

FOREIGN PATENT DOCUMENTS

WO    WO 2021/249120 A1   12/2021

OTHER PUBLICATIONS

European Patent Office, Extended European Search Report, European Patent Application No. 22214637.5, Jun. 6, 2023, nine pages.

*Primary Examiner* — Gerald J Sufleta, II
(74) *Attorney, Agent, or Firm* — Fenwick & West LLP

(57) ABSTRACT

A back-light unit including light-emitting chips and a display apparatus are disclosed. The back-light unit includes a driving voltage line on a substrate, and a ground voltage line spaced apart from the driving voltage line. The light-emitting chips are on a lower insulating layer covering the driving voltage line and the ground voltage line. A driving chip electrically connected to the ground voltage line may be on the substrate. Each of the light-emitting chips may be electrically connected between the driving voltage line and the driving chip by emission connecting lines. A driving dummy pattern and/or a ground dummy pattern is between the light-emitting chips and the emission connecting lines. The driving dummy pattern is electrically connected to the driving voltage line, and the ground dummy pattern is electrically connected to the ground voltage line. Thus, a luminance difference of the light-emitting chips may be prevented or at least reduced.

20 Claims, 5 Drawing Sheets

(51) Int. Cl.
*H01L 25/075* (2006.01)
*H10H 20/857* (2025.01)

(56) References Cited

U.S. PATENT DOCUMENTS

2021/0003878 A1* 1/2021 Wang ................ G02F 1/133305
2022/0163852 A1* 5/2022 Lee ................... G02F 1/133603
2023/0028746 A1* 1/2023 Yang ........................ G09G 3/32

* cited by examiner

BACK-LIGHT UNIT HAVING LIGHT-EMITTING CHIPS AND DISPLAY APPARATUS HAVING THE SAME

CROSS-REFERENCE TO RELATED APPLICATIONS

This application claims the benefit of Republic of Korea Patent Application No. 10-2022-0000003 filed on Jan. 1, 2022, Republic of Korea Patent Application No. 10-2022-0000004 filed on Jan. 1, 2022, and Republic of Korea Patent Application No. 10-2022-0080655 filed on Jun. 30, 2022, each of which is hereby incorporated by reference in its entirety.

BACKGROUND

Field of Technology

The present disclosure relates to a back-light unit in which a light-source module includes light-emitting chips disposed side by side on a light-source substrate, and a display apparatus including the same.

Discussion of the Related Art

Generally, a display apparatus provides an image to user. For example, the display apparatus may include a liquid crystal panel on a back-light unit. The back-light unit may supply light to the liquid crystal panel. For example, the back-light unit may have a stacked structure of a light-source module and an optical sheet.

The light-source module may include light-emitting chips. Each of the light-emitting chips may emit light. For example, the light-emitting chips may be disposed side by side on a light-source substrate. A driving voltage line, a ground voltage line, and a driving chip may be disposed on the light-source substrate. The driving chip may be electrically connected to the ground voltage line. Each of the light-emitting chips may be electrically connected between the driving voltage line and the driving chip by emission connecting lines.

However, in the back-light unit and the display apparatus including the same, a driving voltage applied to each light-emitting chip or a ground voltage applied to the driving chip may be changed by the resistance of the driving voltage line and/or the resistance of the ground voltage line. Thus, in the back-light unit and the display apparatus including the same, the luminance difference of each light-emitting chip may occur.

SUMMARY

Accordingly, the present disclosure is directed to a back-light unit and a display apparatus including the same that substantially obviates one or more problems due to limitations and disadvantages of the related art.

An object of the present disclosure is to provide a back-light unit and a display apparatus including the same capable of preventing or at least reducing the luminance difference of each light-emitting chip.

Another object of the present disclosure is to provide a back-light unit and a display apparatus including the same capable of reducing the resistance of the driving voltage line and/or the resistance of the ground voltage line, without lowering the process efficiency.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a back-light unit comprising: a ground voltage line on a light-source substrate; a lower insulating layer on the light-source substrate, the lower insulating layer on the ground voltage line; a plurality of light-emitting chips on the lower insulating layer, the plurality of light-emitting chips spaced apart the ground voltage line; a plurality of emission connecting lines on the lower insulating layer, the plurality of emission connecting lines electrically connecting together the plurality of light-emitting chips; and a ground dummy pattern between the plurality of light-emitting chips and the plurality of emission connecting lines, the ground dummy pattern overlapping the ground voltage line and electrically connected to the ground voltage line.

In one embodiment, a display apparatus comprises: a back-light unit including a light-source module configured to emit light and an optical sheet on the light-source module; and a liquid crystal panel on the optical sheet of the back-light unit, wherein the light-source module includes: a driving voltage line on a light-source substrate; a lower insulating layer on the driving voltage line; a plurality of light-emitting chips on the lower insulating layer; a driving chip spaced apart from the plurality of light-emitting chips; a plurality of emission connecting lines electrically connecting each of the plurality of light-emitting chips to the driving voltage line and the driving chip; and a driving dummy pattern between the plurality of light-emitting chips and the plurality of emission connecting lines, wherein the plurality of light-emitting chips are non-overlapping with the driving voltage line, and the driving voltage line is electrically connected to the driving dummy pattern.

In one embodiment, a backlight unit comprises: a substrate; a voltage line on a first portion of the substrate; a ground voltage line on a second portion of the substrate that is different from the first portion of the substrate; a first insulating layer on the voltage line and the ground voltage line; a light emitting chip configured to emit light, the light emitting chip positioned between the voltage line and the ground voltage line, and is electrically connected to the voltage line and the ground voltage line; and a first conductive pattern on the first insulating layer, the first conductive pattern overlapping the ground voltage line and electrically connected to the ground voltage line through the first insulating layer.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
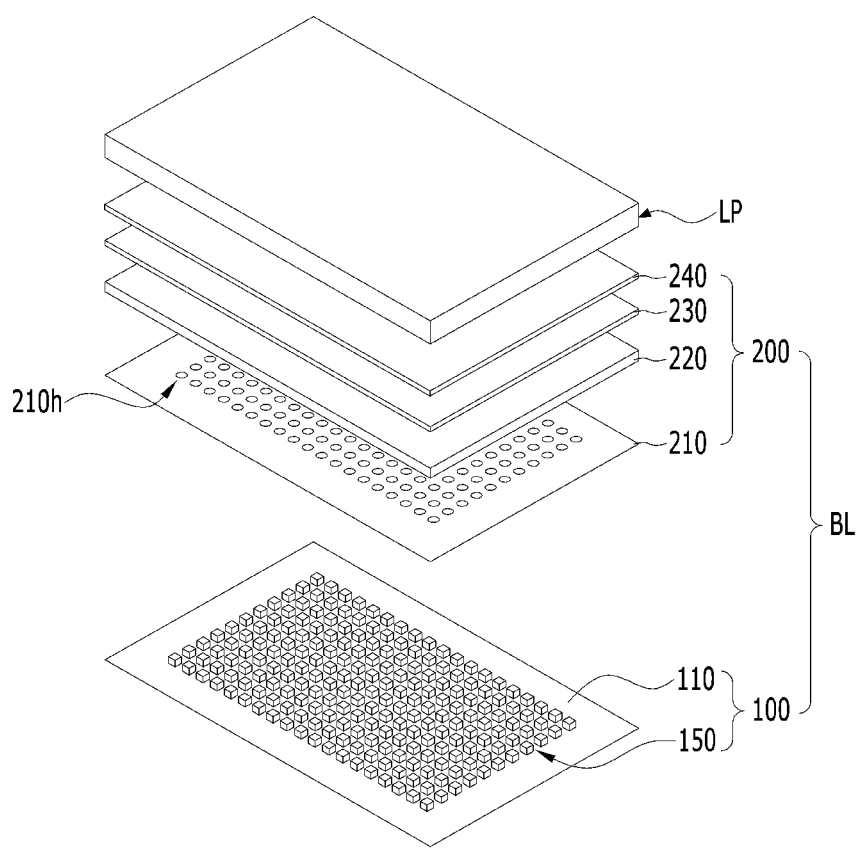
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element. When a first element is described as being disposed on a second element, this may be used to indicate that the first element is disposed above or over the second element, for example disposed in a layer above the second element, either in direct contact with the second element or with another element therebetween. As used herein, the first element being disposed above or over the second element may be used to indicate that the first element is above or over the second element in a vertical direction in a cross-sectional view, i.e. that the first element is closer to a front (display) surface of the display unit or to a front surface of the back-light unit from which light is emitted.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
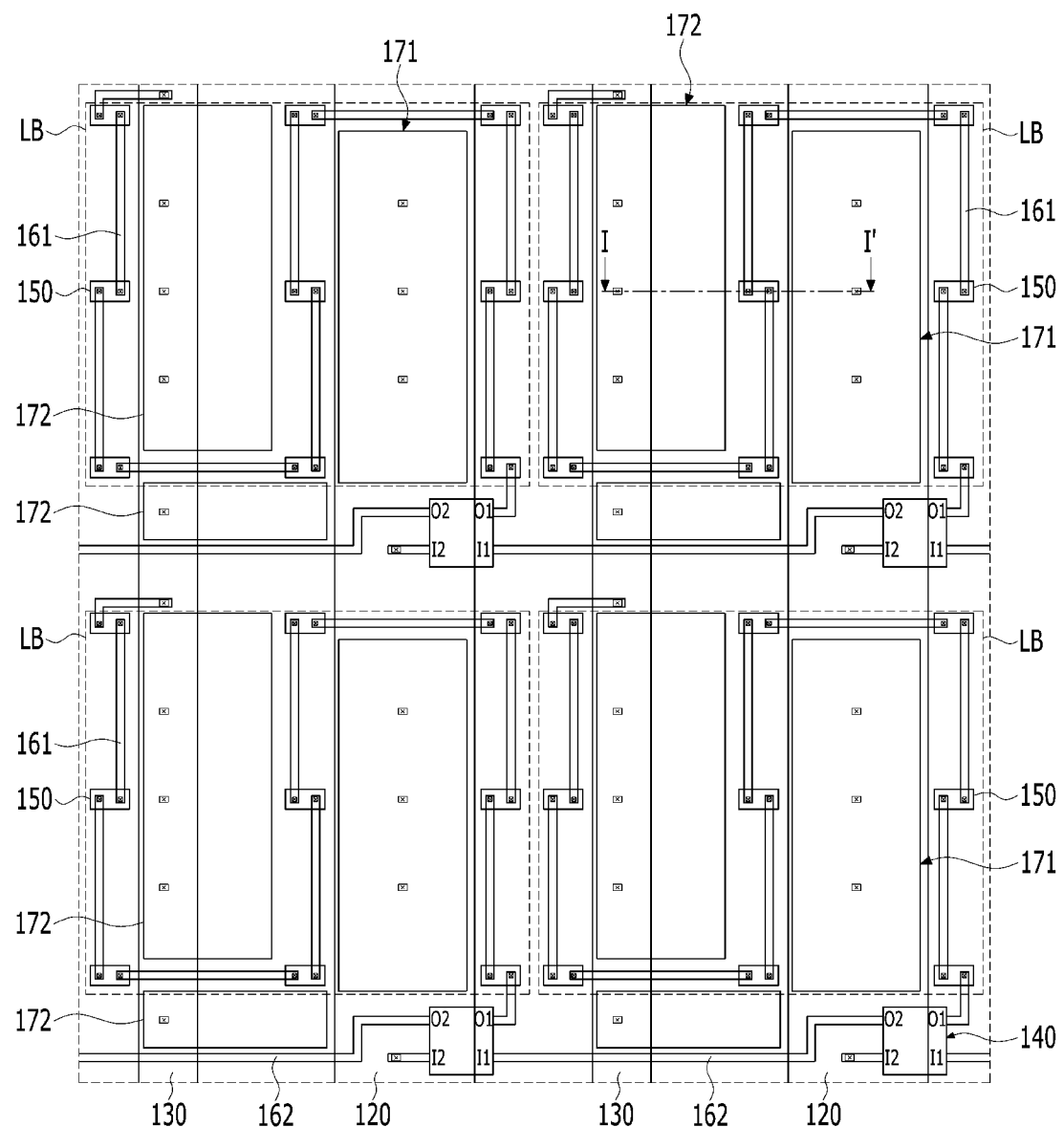
FIG. 2 is a view showing a portion of a light-source module in the display apparatus according to an embodiment of the present disclosure.
Figure 3:
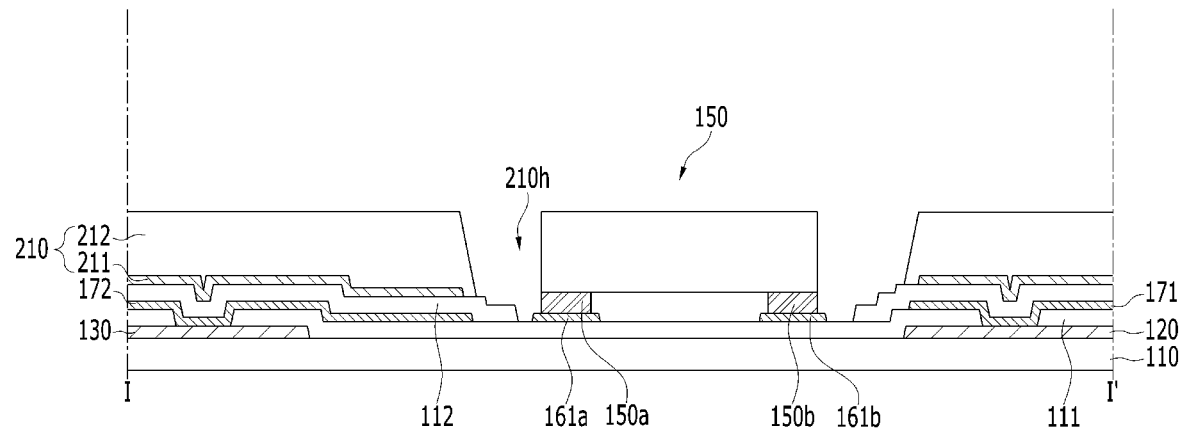
FIG. 3 is a view taken along I-I' of FIG. 2 according to an embodiment of the present disclosure.

FIG. 1 is a view schematically showing a display apparatus according to an embodiment of the present disclosure. FIG. 2 is a view showing a portion of a light-source module in the display apparatus according to an embodiment of the present disclosure. FIG. 3 is a view taken along I-I' of FIG. 2 according to an embodiment of the present disclosure.

Referring to FIGS. 1 to 3, the display apparatus according to the embodiment of the present disclosure may include a back-light unit BL and a liquid crystal panel LP. The liquid crystal panel LP may generate an image displayed to a user using light supplied from the back-light unit BL. For example, the liquid crystal panel LP may include a first substrate in which a plurality of pixel electrodes are formed, a second substrate in which a common electrode is formed, and a liquid crystal layer between the first substrate and the second substrate.

The back-light unit BL may supply the light to the entire area of the liquid crystal panel LP. For example, the back-light unit BL may have a stacked structure of a light-source module 100 and an optical sheet 200.

The light-source module 100 may generate the light supplied to the liquid crystal panel LP. For example, the light-source module 100 may include light-emitting chips 150 on a light-source substrate 110. The light-source substrate 110 may support the light-emitting chips 150. The light-source substrate 110 may include an insulating material. For example, the light-source substrate 110 may include glass or plastic. Each of the light-emitting chips 150 may emit light. For example, each of the light-emitting chips 150 may include a light-emitting diode (LED). The light-emitting chips 150 may be disposed side by side on the light-source substrate 110. For example, the back-light unit of the display apparatus according to the embodiment of the present disclosure may be a direct light type.

A ground voltage line 120 transmitting a ground voltage, a driving voltage line 130 supplying a driving voltage to the light-emitting chips 150, and a driving chip 140 controlling a turn on or turn off of the light-emitting chips 150 may be disposed on the light-source substrate 110. Thus, the light-emitting chips 150 are electrically connected to the driving voltage line 130 and the ground voltage line 120. As shown in FIG. 3, the driving voltage line 130 may be on a first portion of the light-source substrate 110 and the ground voltage line 120 may be on a second portion of the light-source substrate 110 that is different from the first portion.

The ground voltage line 120 may include a conductive material. The ground voltage line 120 may include a material having a relative low resistance. For example, the ground voltage line 120 may include a metal, such as copper (Cu), nickel (Ni), silver (Ag), gold (Au), platinum (Pt), and aluminum (Al). The ground voltage line 120 may extend in a direction.

The driving voltage line 130 may include a conductive material. The driving voltage line 130 may include a material having a relative low resistance. For example, the driving voltage line 130 may include a metal, such as copper (Cu), nickel (Ni), silver (Ag), gold (Au), platinum (Pt), and aluminum (Al). The driving voltage line 130 may include the same material as the ground voltage line 120. The driving voltage line 130 may be formed in the same process as the ground voltage line 120. For example, the driving voltage line 130 may be formed simultaneously with the ground voltage line 120. The driving voltage line 130 may be disposed on the same layer as the ground voltage line 120. The driving voltage line 130 may be spaced away from the ground voltage line 120. For example, the driving voltage line 130 may extend in parallel with the ground voltage line 120.

The driving chip 140 may include a first input terminal I1 to which an address signal is input, a second input terminal I2 to which the ground voltage is input, and a first output terminal O1 from which a control signal for controlling the operation of the light-emitting chips 150 is output. For example, the second input terminal I2 of the driving chip 140 may be electrically connected to the ground voltage line 120. Each of the light-emitting chips 150 may be electrically connected between the driving voltage line 130 and the first output terminal O1 of the driving chip 140. For example, each of the light-emitting chips 150 may include a first chip pad 150a to which the driving voltage is applied by the driving voltage line 130, and a second chip pad 150b to which the control signal is applied by the driving chip 140.

The driving chip 140 and the light-emitting chips 150 may be disposed on a layer different from the ground voltage line 120 and the driving voltage line 130. For example, a lower insulating layer 111 covering the ground voltage line 120 and the driving voltage line 130 may be disposed on the light-source substrate 110, and the driving chip 140 and the light-emitting chips 150 may be disposed on the lower insulating layer 111. The lower insulating layer 111 may include an insulating material. For example, the lower insulating layer 111 may be an inorganic layer made of an inorganic insulating material, such as silicon oxide (SiOx) and silicon nitride (SiNx). The lower insulating layer 111 may have a multi-layer structure. For example, the lower insulating layer 111 may have a stacked structure of an inorganic layer made of silicon oxide (SiOx) and an inorganic layer made of silicon nitride (SiNx). Thus, in the display apparatus according to the embodiment of the present disclosure, the diffusion and/or the movement of the metal constituting the ground voltage line 120 and the metal constituting the driving voltage line 130 through adjacent components may be prevented or at least reduced. That is, in the display apparatus according to the embodiment of the present disclosure, the migration of the metal constituting the ground voltage line 120 and the metal constituting the driving voltage line 130 may be prevented or at least reduced.

The light-emitting chips 150 may be disposed outside the ground voltage line 120 and the driving voltage line 130. That is, the light-emitting chips 150 are non-overlapping with each of the ground voltage line 120 and the driving voltage line 130. For example, the ground voltage line 120 and the driving voltage line 130 may extend in a direction between the light-emitting chips 150. The light-emitting chips 150 may be spaced away from the ground voltage line 120 and the driving voltage line 130. For example, as shown in FIG. 3, the light emitting chip 150 is between the ground voltage line 120 and the driving voltage line 130 in a horizontal direction. In other words, the plurality of light emitting chip(s) 150 may be spaced apart from the ground voltage line 120 and the driving voltage line 130 in a direction parallel to a front (display) surface of the display apparatus, i.e. in a direction parallel to a front surface of the back-light unit from which light is emitted. Thus, in the display apparatus according to the embodiment of the present disclosure, the malfunction of the light-emitting chips 150 due to parasitic capacitance formed between the ground voltage line 120 and the light-emitting chips 150 and/or between the driving voltage line 130 and the light-emitting chips 150 may be prevented or at least reduced.

Each of the light-emitting chips 150 may be controlled differently from an adjacent light-emitting chip 150. For example, in the back-light unit BL of the display apparatus according to the embodiment of the present disclosure, the light source substrate 110 may be divided into a plurality of light-emitting blocks LB, and the light-emitting chips 150 in each light-emitting block LB may be simultaneously controlled by one driving chip 140. Thus, in the display apparatus according to the embodiment of the present disclosure, the local dimming in which light having different luminance for each area is provided to the liquid crystal panel LP by the back-light unit BL may be implemented. The driving chip 140 of each light-emitting block LB may transmit the address signal to the driving chip 140 of adjacent light-emitting block LB. For example, the driving chip 140 of each light-emitting block LB may include a second output terminal O2 for transmitting the address signal, and the first input terminal I1 of one of the driving chips 140 may be electrically connected to the second output terminal O2 of adjacent driving chip 140 by an address connecting line 162. The address connecting line 162 may include a conductive material. The address connecting line 162 may include a material having a relative low resistance. For example, the address connecting line 162 may include a metal, such as copper (Cu), nickel (Ni), silver (Ag), gold (Au), platinum (Pt), and aluminum (Al). The address connecting line 162 may be disposed on the lower insulating layer 111.

The light-emitting chips 150 may be connected to each other by emission connecting lines 161. For example, the light-emitting chips 150 in each light-emitting block LB may be connected in series between the driving voltage line 130 and the driving chip 140 by the emission connecting lines 161. The emission connecting lines 161 may include a conductive material. The emission connecting lines 161 may include a material having a relative low resistance. For example, the emission connecting lines 161 may include a metal, such as copper (Cu), nickel (Ni), silver (Ag), gold (Au), platinum (Pt), and aluminum (Al). The emission connecting lines 161 may be disposed on the lower insulating layer 111. For example, each of the emission connecting lines 161 between the light-emitting chips 150 may include a first end 161a being in contact with the first chip pad 150a of one of the light-emitting chips 150, and a second end 161b being in contact with the second chip pad 150b of one of the light-emitting chips 150. The emission connecting lines 161 may include the same material as the address connecting line 162. The emission connecting lines 161 may be formed in the same process as the address connecting line 162. For example, the emission connecting lines 161 may be formed simultaneously with the address connecting line 162. The emission connecting lines 161 may be disposed on the same layer as the address connecting line 162.

A ground dummy pattern 171 and a driving dummy pattern 172 may be disposed between the light-emitting chips 150, between the emission connecting lines 161 and/or between the light-emitting chips 150 and the emission connecting lines 161. The ground dummy pattern 171 and the driving dummy pattern 172 may include a conductive material. The ground dummy pattern 171 and the driving dummy pattern 172 may include a material having a relative low resistance. For example, the ground dummy pattern 171 and the driving dummy pattern 172 may include a metal, such as copper (Cu), nickel (Ni), silver (Ag), gold (Au), platinum (Pt), and aluminum (Al).

The ground dummy pattern 171 may be electrically connected to the ground voltage line 120. The ground dummy pattern 171 may overlap the ground voltage line 120. For example, the lower insulating layer 111 may include at least one ground contact hole partially exposing the ground voltage line 120. The ground dummy pattern 171 may be in direct contact with the ground voltage line 120 through the ground contact hole. Thus, in the display apparatus according to the embodiment of the present disclosure, the resistance of the ground voltage line 120 may be reduced. As used herein, references to a first element overlapping a second element may be used to indicate that the first element overlaps the second element vertically in a cross-sectional view, i.e. that the first element is aligned with the second element in a direction between the back surface of the display apparatus and the front (display) surface of the display apparatus or between the back surface of the back-light unit and the front surface of the back-light unit from which light it emitted.

The ground dummy pattern 171 may include the same material as the emission connecting lines 161. The ground dummy pattern 171 may be formed in the same process as the emission connecting lines 161. For example, the ground dummy pattern 171 may be formed simultaneously with the emission connecting lines 161. The ground dummy pattern 171 may be disposed on the same layer as the emission connecting lines 161. Thus, in the display apparatus according to the embodiment of the present disclosure, the resistance of the ground voltage line 120 may be reduced, without lowering the process efficiency.

The driving dummy pattern 172 may be electrically connected to the driving voltage line 130. The driving dummy pattern 172 may overlap the driving voltage line 130. For example, the lower insulating layer 111 may include at least one driving contact hole partially exposing the driving voltage line 130. The driving dummy pattern 172 may be in direct contact with the driving voltage line 130 through the driving contact hole. Thus, in the display apparatus according to the embodiment of the present disclosure, the resistance of the driving voltage line 130 may be reduced.

The driving dummy pattern 172 may include the same material as the ground dummy pattern 171. For example, the driving dummy pattern 172 may be formed simultaneously with the ground dummy pattern 171. The driving dummy pattern 172 may be disposed on the same layer as the ground dummy pattern 171. Thus, in the display apparatus according to the embodiment of the present disclosure, the resistance of the driving voltage line 130 may be reduced, without lowering the process efficiency.

An upper insulating layer 112 may be disposed on the emission connecting lines 161, the address connecting line 162, the ground dummy pattern 171 and the driving dummy pattern 172. The upper insulating layer 112 may include an insulating material. For example, the upper insulating layer 112 may be an inorganic layer made of an inorganic insulating material, such as silicon oxide (SiOx) and silicon nitride (SiNx). The upper insulating layer 112 may have a multi-layer structure. For example, the upper insulating layer 112 may have a stacked structure of an inorganic layer made of silicon oxide (SiOx) and an inorganic layer made of silicon nitride (SiNx).

Thus, in the display apparatus according to the embodiment of the present disclosure, the diffusion and/or the movement of the metal constituting the emission connecting lines 161, the metal constituting the address connecting line 162, the metal constituting the ground dummy pattern 171, and the metal constituting the driving dummy pattern 172 through adjacent components may be prevented or at least reduced. That is, in the display apparatus according to the embodiment of the present disclosure, the migration of the metal constituting the emission connecting lines 161, the metal constituting the address connecting line 162, the metal constituting the ground dummy pattern 171, and the metal constituting the driving dummy pattern 172 may be prevented or at least reduced. The upper insulating layer 112 may surround the light-emitting chips 150. For example, the first end 161a and the second end 161b of each emission connecting line 161 may be disposed outside the upper insulating layer 112. The ground dummy pattern 171 and the driving dummy pattern 172 may be covered by the upper insulating layer 112. Therefore, in the display apparatus according to the embodiment of the present disclosure, the electrical connection between the emission connecting lines 161 and the ground dummy pattern 171 and/or between the emission connecting lines 161 and the driving dummy pattern 172 may be prevented or at least reduced.

The optical sheet 200 may uniformly supply the light emitted from the light-source module 100 to the entire area of the liquid crystal panel LP. For example, the optical sheet 200 may include a reflective plate 210, a diffusion plate 220, a phosphor sheet 230, and a prism sheet 240. The liquid crystal panel LP may be disposed on the optical sheet 200 of the back-light unit BL.

The reflective plate 210 may re-reflect light reflected by the diffusion plate 220, the phosphor sheet 230 and the prism sheet 240 in a direction of the liquid crystal panel LP. For example, the reflective plate 210 may include a reflecting pattern 211 (e.g., a reflecting layer). The reflecting pattern 211 may include a material having high reflectivity. For example, the reflecting pattern 211 may include a metal, such as aluminum Al and silver Ag.

The reflective plate 210 may reflect the light emitted through a side of each light-emitting chip 150 in a direction of the liquid crystal panel LP. For example, the reflecting pattern 211 may be in contact with the upper insulating layer 112 of the light-source module 100, and the reflective plate 210 may include a scattering layer 212 covering the reflecting pattern 211. The scattering layer 212 may surround the side of each light-emitting chip 150. For example, the reflective plate 210 may include penetrating holes 210h into which the light-emitting chips 150 are inserted. Thus, in the display apparatus according to the embodiment of the present disclosure, the light emitted through the side of each light-emitting chip 150 may be scattered by the scattering layer 212, and the light scattered by the scattering layer 212 may be reflected in the direction of the liquid crystal panel LP by the reflecting pattern 211. That is, in the display apparatus according to the embodiment of the present disclosure, the efficiency of the light-source module 100 may be improved. The scattering layer 212 may include an insulating material. Therefore, in the display apparatus according to the embodiment of the present disclosure, the electrically connection between the light-emitting chips 150 due to the reflective plate 210 may be prevented or at least reduced.

The diffusion plate 220 may diffuse the light emitted by each light-emitting chip 150. The phosphor sheet 230 may realize various colors using the light emitted by the light-emitting chips 150. For example, the light supplied to the liquid crystal panel LP passing through the phosphor sheet 230 may be white light. The prism sheet 240 may improve the luminance of the light supplied to the liquid crystal panel LP by condensing light.

FIGS. 4 to 8 are views schematically showing a method of forming a back-light unit in the display apparatus according to the embodiment of the present disclosure.

Figure 4:
FIGS. 4 to 8 are views schematically showing a method of forming a back-light unit in the display apparatus according to the embodiment of the present disclosure.

The method of forming the back-light unit in the display apparatus according to the embodiment of the present disclosure will be described with reference to FIGS. 3 to 8. First, the method of forming the back-light unit in the display apparatus according to the embodiment of the present disclosure may include a step of forming the ground voltage line 120 and the driving voltage line 130 on the light-source substrate 110, as shown in FIG. 4.

The ground voltage line 120 and the driving voltage line 130 may be formed of a conductive material. The ground voltage line 120 and the driving voltage line 130 may be formed of a material having a relative low resistance. For example, the ground voltage line 120 and the driving voltage line 130 may be formed of a metal, such as copper (Cu), nickel (Ni), silver (Ag), gold (Au), platinum (Pt), and aluminum (Al). The driving voltage line 130 may be formed of the same material as the ground voltage line 120. The driving voltage line 130 may be formed by the same process as the ground voltage line 120. The driving voltage line 130 may be formed simultaneously with the ground voltage line 120. For example, the step of forming the ground voltage line 120 and the driving voltage line 130 may include a step of forming a metal layer on the light-source substrate 110, and a step of patterning the metal layer. The ground voltage line 120 and the driving voltage line 130 may be formed on the same layer.

Figure 5:

The method of forming the back-light unit in the display apparatus according to the embodiment of the present disclosure may include a step of forming the lower insulating layer 111 on the light-source substrate 110 in which the ground voltage line 120 and the driving voltage line 130 are formed, and a step of forming a ground contact hole h1 partially exposing the ground voltage line 120 and a driving contact hole h2 partially exposing the driving voltage line 130 in the lower insulating layer 111, as shown in FIG. 5.

The lower insulating layer 111 may be formed of an insulating material. For example, the lower insulating layer 111 may be formed of an inorganic insulating material, such as silicon oxide (SiOx) and silicon nitride (SiNx). The ground voltage line 120 and the driving voltage line 130 may be covered by the lower insulating layer 111.

Figure 6:
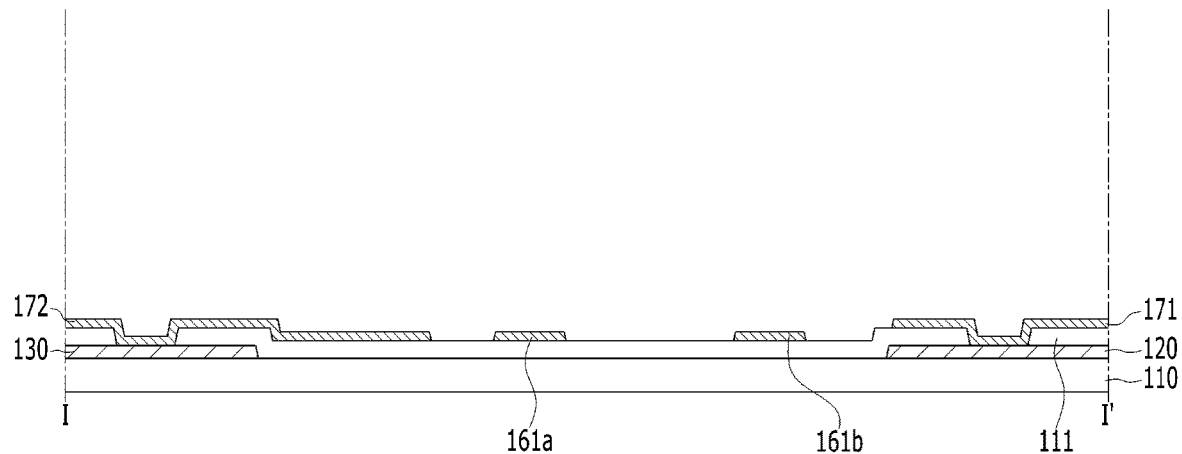

The method of forming the back-light unit in the display apparatus according to the embodiment of the present disclosure may include a step of forming the emission connecting lines 161, the ground dummy pattern 171 and driving dummy pattern 172 on the lower insulating layer 111, as shown in FIG. 6.

The emission connecting lines 161, the ground dummy pattern 171 and the driving dummy pattern 172 may be formed of a conductive material. The emission connecting lines 161, the ground dummy pattern 171 and the driving dummy pattern 172 may be formed of a material having a relative low resistance. For example, the emission connecting lines 161, the ground dummy pattern 171 and the driving dummy pattern 172 may be formed of a metal, such as copper (Cu), nickel (Ni), silver (Ag), gold (Au), platinum (Pt), and aluminum (Al). The emission connecting lines 161, the ground dummy pattern 171 and the driving dummy pattern 172 may be formed of the same material. The emission connecting lines 161, the ground dummy pattern 171 and the driving dummy pattern 172 may be formed by the same process. The emission connecting lines 161, the ground dummy pattern 171 and the driving dummy pattern 172 may be simultaneously formed. For example, the step of forming the emission connecting lines 161, the ground dummy pattern 171 and the driving dummy pattern 172 may include a step of forming a metal layer on the lower insulating layer 111 and a step of patterning the metal layer. The emission connecting lines 161, the ground dummy pattern 171 and the driving dummy pattern 172 may be formed on the same layer.

The emission connecting lines 161 may be formed between the ground voltage line 120 and the driving voltage line 130. For example, the emission connecting lines 161 may be spaced away from the ground voltage line 120 and the driving voltage line 130. The ground dummy pattern 171 may be formed on the ground voltage line 120. For example, the ground dummy pattern 171 may be electrically connected to the ground voltage line 120 through the ground contact hole. The ground dummy pattern 171 may overlap the ground voltage line 120. The driving dummy pattern 172 may be formed on the driving voltage line 130. For example, the driving dummy pattern 172 may be electrically connected to the driving voltage line 130. The driving dummy pattern 172 may overlap the driving voltage line 130.

Figure 7:
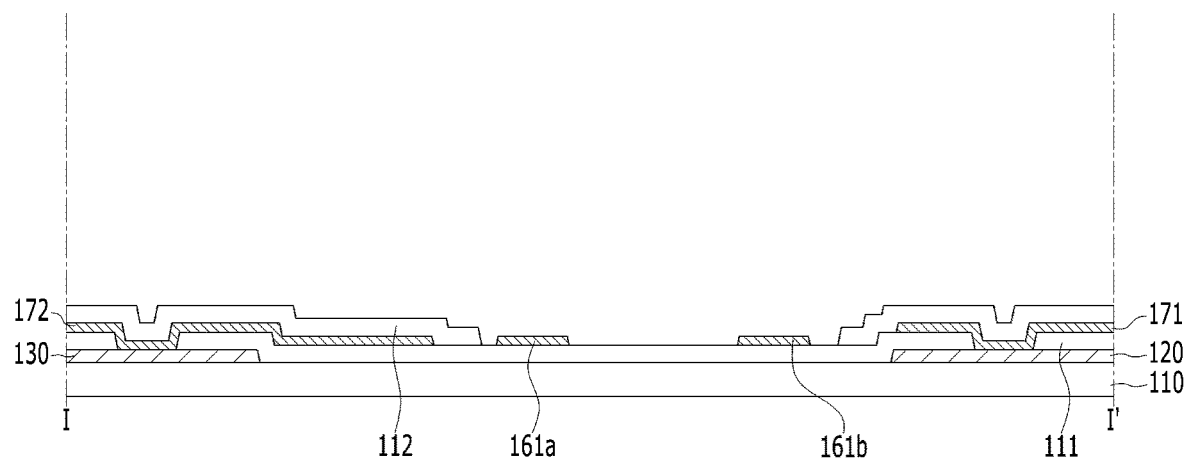

The method of forming the back-light unit in the display apparatus according to the embodiment of the present disclosure may include a step of forming the upper insulating layer 112 on the light-source substrate 110 in which the emission connecting lines 161, the ground dummy pattern 171 and the driving dummy pattern 172 is formed, as shown in FIG. 7.

The upper insulating layer 112 may be formed of an insulating material. For example, the upper insulating layer 112 may be formed of an inorganic insulating material, such as silicon oxide (SiOx) and silicon nitride (SiNx). The ground dummy pattern 171 and the driving dummy pattern 172 may be covered by the upper insulating layer 112. The upper insulating layer 112 may expose both ends of each emission connecting line 161a and 161b. For example, the upper insulating layer 112 may surround a region in which the light emitting chips 150 are arranged by a subsequent process.

Figure 8:
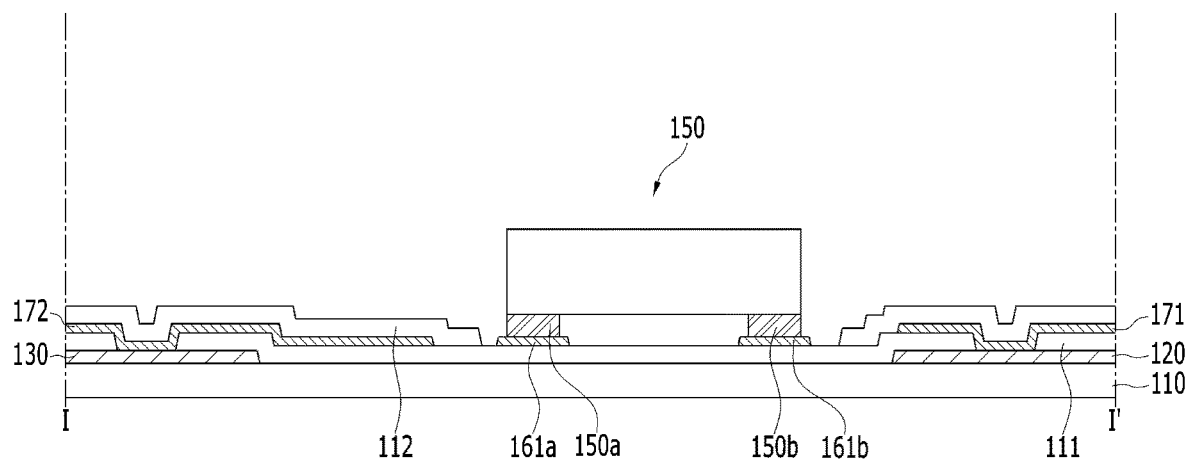

The method of forming the back-light unit in the display apparatus according to the embodiment of the present disclosure may include a step of bonding the light-emitting chips 150 on the light-source substrate 110 in which the upper insulating layer 112 is formed, as shown in FIG. 8.

Each of the light-emitting chips 150 may include the first chip pad 150a and the second chip pad 150b. For example, the first chip pad 150a of each light-emitting chip 150 may be connected to the first end 161a of one of the emission connecting lines 161, and the second chip pad 150b of each light-emitting chip 150 may be connected to the second end 161b of one of the emission connecting lines 161. Thus, in method of forming the back-light unit in the display apparatus according to the embodiment of the present disclosure, the light-emitting chips 150 may be connected to each other by the emission connecting lines 161.

The method of forming the back-light unit in the display apparatus according to the embodiment of the present disclosure may include a step of arranging the reflective plate 210 including penetrating holes 210h corresponding to the light-emitting chips 150 on the upper insulating layer 112, as shown in FIG. 3. The penetrating hole 210h is an opening in which a corresponding light-emitting chip 150 is disposed.

Accordingly, in the display apparatus according to the embodiment of the present disclosure, the light-source module 100 of the back-light unit BL may include the lower insulating layer 111 covering the ground voltage line 120 and the driving voltage line 130, the light-emitting chips 150 disposed on the lower insulating layer 111, the emission connecting lines 161 connecting between the light-emitting chips 150, the ground dummy pattern 171 overlapping with the ground voltage line 120, and the driving dummy pattern 172 overlapping with the driving voltage line 130, wherein the ground dummy pattern 171 and the driving dummy pattern 172 may be disposed between the light-emitting chips 150 and the emission connecting lines 161, wherein the ground dummy pattern 171 may be electrically connected to the ground voltage line 120 by penetrating the lower insulating layer 111, and wherein driving dummy pattern 172 may be electrically connected to the driving voltage line 130 by penetrating the lower insulating layer 111. Thus, in the display apparatus according to the embodiment of the present disclosure, the resistance of the ground voltage line 120 and the resistance of the driving voltage line 130 may be reduced. And, in the display apparatus according to the embodiment of the present disclosure, the ground dummy pattern 171 and the driving dummy pattern 172 may be formed by the same process as the emission connecting lines 161. For example, in the display apparatus according to the embodiment of the present disclosure, the ground dummy pattern 171 and the driving dummy pattern 172 may be formed simultaneously with the emission connecting lines 161. Therefore, in the display apparatus according to the embodiment of the present disclosure, the luminance difference of the light-emitting chips 150 may be prevented or at least reduced, without lowering the process efficiency.

Furthermore, in the display apparatus according to the embodiment of the present disclosure, the ground dummy pattern 171 and the driving dummy pattern 172 may be formed between the light-emitting chips 150, between the emission connecting lines 161 and/or between the light-emitting chips 150 and the emission connecting lines 161. Thus, in the display apparatus according to the embodiment of the present disclosure, the resistance of the ground voltage line 120 and the resistance of the driving voltage line 130 may be reduced, without increasing a non-emission area in which the light-emitting chips 150 are not disposed. That is, in the display apparatus according to the embodiment of the present disclosure, the size of a light-emitting area in which the light is emitted by the light-emitting chips 150 is maintained, and the luminance difference of the light-emitting chips 150 may be prevented or at least reduced. Therefore, in the display apparatus according to the embodiment of the present disclosure, the quality of the image provided to the user may be effectively improved.

The display apparatus according to the embodiment of the present disclosure is described that the second output terminal O2 of each driving chip 140 is connected to the first input terminal I1 of adjacent driving chip 140 in the first direction by the address connecting line 162. That is, in the display apparatus according to the embodiment of the present disclosure, an address wire to which the address signal is applied from the outside through a pad part may be connected to the first input terminals I1 of the driving chip 140 arranged at the outermost side among the driving chips 140 which are disposed side by side in the first direction. However, in the display apparatus according to another embodiment of the present disclosure, the first input terminal I1 of each driving chip 140 may be individually connected to the address wire. For example, in the display apparatus according to another embodiment of the present disclosure, the first input terminal I1 of each driving chip 140 may be connected to the address wire different from the first input terminal I1 of adjacent driving chip 140 in the first direction. In the display apparatus according to another embodiment of the present disclosure, the address connecting line 162 and the second output terminal O2 of each driving chip 140 may be omitted. Thus, in the display apparatus according to another embodiment of the present disclosure, turn on and turn off and luminance of each light-emitting block LB may be independently controlled. Therefore, in the display apparatus according to another embodiment of the present disclosure, the local dimming may be effectively implemented.

The display apparatus according to the embodiment of the present disclosure is described that a signal applied by the driving voltage line 130 electrically connected to the light-emitting chips 150 is different from a signal applied to the ground voltage line 120 electrically connected to the driving chip 140. However, in the display apparatus according to another embodiment of the present disclosure, the driving voltage line 130 may be electrically connected to the ground voltage line 120. For example, in the display apparatus according to another embodiment of the present disclosure, a driving voltage corresponding to the luminance of each light-emitting chip 150 may be generated/applied by the driving chip 140.

The display apparatus according to the embodiment of the present disclosure is described that the ground dummy pattern 171 and the driving dummy pattern 172 are disposed on the lower insulating layer 111. However, in the display apparatus according to another embodiment of the present disclosure, one of the ground dummy pattern 171 and the driving dummy pattern 172 may be formed. Thus, in the display apparatus according to another embodiment of the present disclosure, the degree of freedom for the configuration of the light-source module 100 may be improved.

Figure 9:
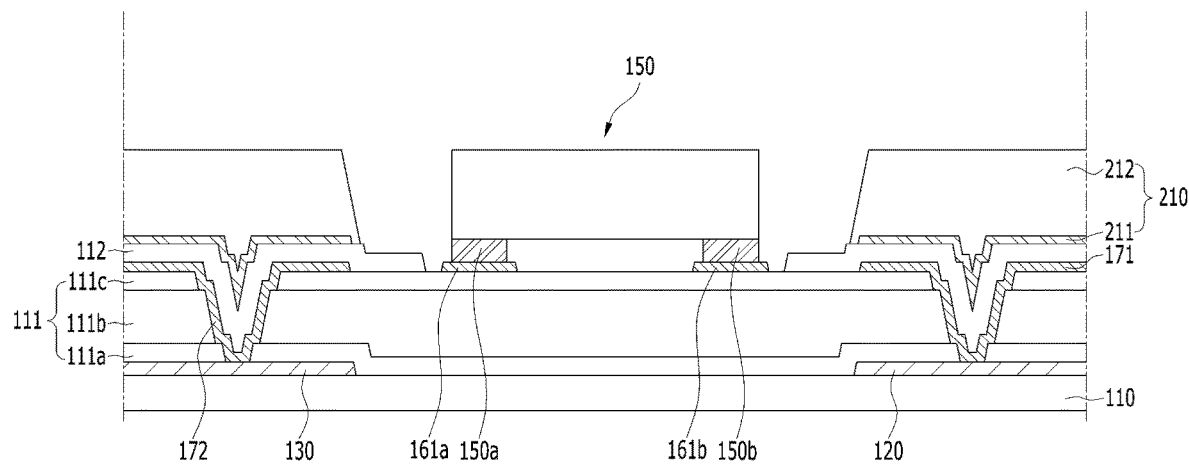
FIGS. 9 and 10 are views showing the display apparatus according to other embodiments of the present disclosure.

The display apparatus according to the embodiment of the present disclosure is described that the lower insulating layer 111 is made of an inorganic insulating material, such as silicon oxide (SiOx) and silicon nitride (SiNx). However, in the display apparatus according to another embodiment of the present disclosure, the lower insulating layer 111 may have a multi-layer structure of an inorganic layer made of an inorganic insulating material and an organic layer made of an organic insulating material, as shown in FIG. 9. For example, in the display apparatus according to another embodiment of the present disclosure, the lower insulating layer 111 may have a stacked structure of a first lower layer 111a, a second lower layer 111b and a third lower layer 111c, as shown in FIG. 9. The second lower layer 111b may include a material different from the first lower layer 111a and the third lower layer 111c. For example, the first lower layer 111a, which is the lowest layer of the lower insulating layer 111 disposed closest to the ground voltage line 120 and the driving voltage line 130, and the third lower layer 111c, which is the uppermost layer of the lower insulating layer 111 disposed close to the ground dummy pattern 171 and the driving dummy pattern 172 may be the inorganic layer made of an inorganic insulating material, such as silicon oxide (SiOx) and silicon nitride (SiNx), and the second lower layer 111b disposed between the first lower layer 111a and the third lower layer 111c may be an organic layer made of an organic insulating material. Thus, in the display apparatus according to another embodiment of the present disclosure, the diffusion of the metal constituting the ground voltage line 120, the metal constituting the driving voltage line 130, the metal constituting the ground dummy pattern 171, and the metal constituting the driving dummy pattern 172 through the second lower layer 111b, which is an organic layer, may be prevented or at least reduced.

Figure 10:
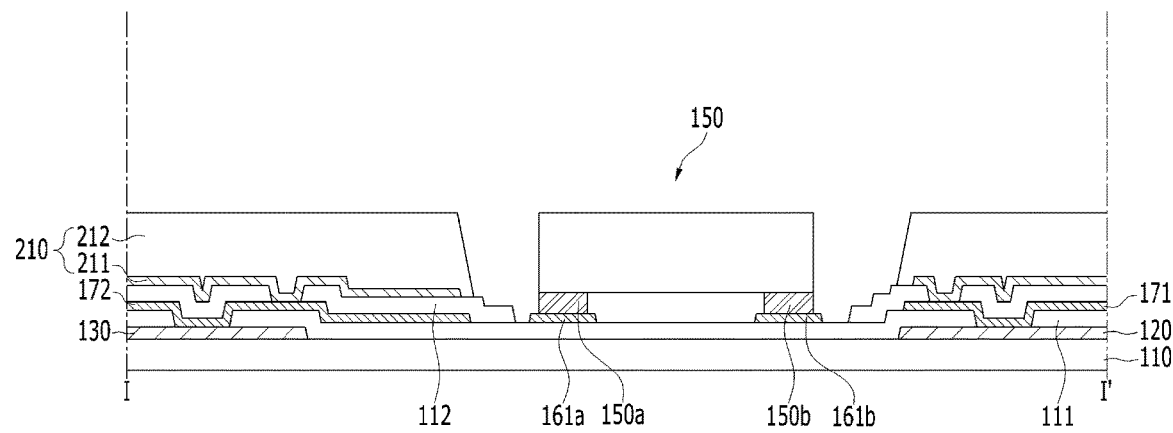

In the display apparatus according to another embodiment of the present disclosure, the reflecting pattern 211 may include a conductive material. For example, in the display apparatus according to another embodiment of the present disclosure, the reflecting pattern 211 may be electrically connected to the ground dummy pattern 171 and the driving dummy pattern 172 by penetrating the upper insulating layer 112, as shown in FIG. 10. Thus, in the display apparatus according to another embodiment of the present disclosure, the resistance of the ground voltage line 120 and the resistance of the driving voltage line 130 may be greatly reduced. Therefore, in the display apparatus according to the embodiment of the present disclosure, the luminance difference of the light-emitting chips 150 may be effectively prevented or at least reduced.

In the result, the back-light unit and the display apparatus according to the embodiments of the present disclosure may include the lower insulating layer covering the driving voltage line and the ground voltage line, the light-emitting chips disposed on the lower insulating layer, and the emission connecting lines connecting between the light-emitting chips, wherein the driving dummy pattern electrically connected to the driving voltage line and/or the ground dummy pattern electrically connected to the ground voltage line may be disposed between the light-emitting chips and the emission connecting lines. Thus, in the back-light unit and the display apparatus according to the embodiments of the present disclosure, the resistance of the ground voltage line and the resistance of the driving voltage line may be reduced. Thereby, in the back-light unit and the display apparatus according to the embodiments of the present disclosure, the luminance difference of the light-emitting chips may be effectively prevented or at least reduced.

What is claimed is:

1. A back-light unit comprising:
a ground voltage line on a light-source substrate;
a lower insulating layer on the light-source substrate, the lower insulating layer on the ground voltage line;
a plurality of light-emitting chips on the lower insulating layer, the plurality of light-emitting chips spaced apart the ground voltage line;
a plurality of emission connecting lines on the lower insulating layer, the plurality of emission connecting lines electrically connecting together the plurality of light-emitting chips;
a ground dummy pattern between the plurality of light-emitting chips and the plurality of emission connecting lines, the ground dummy pattern overlapping the ground voltage line and electrically connected to the ground voltage line,
an upper insulating layer on the plurality of emission connecting lines and the ground dummy pattern, the upper insulating layer surrounding the plurality of light-emitting chips; and
a reflective plate on the upper insulating layer, the reflective plate including penetrating holes into which the plurality of light-emitting chips are inserted.

2. The back-light unit according to claim 1, wherein the ground dummy pattern includes a same material as the plurality of emission connecting lines.

3. The back-light unit according to claim 1, further comprising:
a driving voltage line between the light-source substrate and the lower insulating layer, the driving voltage line spaced apart from the ground voltage line; and
a driving chip spaced apart from the plurality of light-emitting chips, the plurality of emission connecting lines, and the ground dummy pattern, the driving chip electrically connected to the ground voltage line,
wherein each of the plurality of light-emitting chips is electrically connected to the driving voltage line and the driving chip.

4. The back-light unit according to claim 3, wherein the plurality of light-emitting chips are connected in series by the plurality of emission connecting lines.

5. The back-light unit according to claim 3, further comprising:
a driving dummy pattern between the plurality of light-emitting chips and the plurality of emission connecting lines, the driving dummy pattern overlapping the driving voltage line and electrically connected to the driving voltage line.

6. The back-light unit according to claim 5, wherein the driving dummy pattern includes a same material as the ground dummy pattern.

7. The back-light unit according to claim 1, wherein the lower insulating layer includes an inorganic layer made of at least one inorganic insulating material and an organic layer made of an organic insulating material.

8. The back-light unit according to claim 7, wherein a lowest layer of the lower insulating layer closest to the ground voltage line and an uppermost layer of the lower insulating layer closest to the ground dummy pattern are the inorganic layer.

9. A display apparatus comprising:
a back-light unit including a light-source module configured to emit light and an optical sheet on the light-source module; and
a liquid crystal panel on the optical sheet of the back-light unit,
wherein the light-source module includes:
a driving voltage line on a light-source substrate;
a lower insulating layer on the driving voltage line;
a plurality of light-emitting chips on the lower insulating layer;
a driving chip spaced apart from the plurality of light-emitting chips;
a plurality of emission connecting lines electrically connecting each of the plurality of light-emitting chips to the driving voltage line and the driving chip;
a driving dummy pattern between the plurality of light-emitting chips and the plurality of emission connecting lines; and
an upper insulating layer on the plurality of emission connecting lines and the driving dummy pattern, the upper insulating layer surrounding the plurality of light-emitting chips,
wherein the plurality of light-emitting chips are non-overlapping with the driving voltage line, and the driving voltage line is electrically connected to the driving dummy pattern,
wherein the optical sheet includes a reflective plate on the upper insulating layer, the reflective plate comprising a reflecting pattern having a conductive material and electrically connected to the driving dummy pattern, and a scattering layer that covers the reflecting pattern.

10. The display apparatus according to claim 9, wherein the driving dummy pattern includes a same material as the plurality of emission connecting lines.

11. The display apparatus according to claim 9, wherein the reflecting pattern includes a metal.

12. The display apparatus according to claim 9, wherein the reflecting pattern includes a metal, and the scattering layer includes an insulating material.

13. The display apparatus according to claim 9, wherein the light-source module further includes:
   a ground voltage line between the light-source substrate and the lower insulating layer such that the ground voltage line is spaced apart from the plurality of light-emitting chips; and
   a ground dummy pattern between the lower insulating layer and the upper insulating layer, the ground dummy pattern electrically connected to the ground voltage line and the reflecting pattern.

14. The display apparatus according to claim 13, wherein the ground voltage line includes a same material as the driving voltage line.

15. The display apparatus according to claim 13, wherein the ground voltage line is on a same layer as the driving voltage line, and the ground dummy pattern is on a same layer as the driving dummy pattern and the plurality of emission connecting lines.

16. A backlight unit comprising:
   a substrate;
   a voltage line on a first portion of the substrate;
   a ground voltage line on a second portion of the substrate that is different from the first portion of the substrate;
   a first insulating layer on the voltage line and the ground voltage line;
   a light emitting chip configured to emit light, the light emitting chip positioned between the voltage line and the ground voltage line, and is electrically connected to the voltage line and the ground voltage line;
   a first conductive pattern on the first insulating layer, the first conductive pattern overlapping the ground voltage line and electrically connected to the ground voltage line through the first insulating layer;
   a second conductive pattern on the first insulating layer, the second conductive pattern overlapping the voltage line and electrically connected to the voltage line through the first insulating layer;
   a second insulating layer on the first conductive pattern and the second conductive pattern, the second insulating layer non-overlapping with the light emitting chip; and
   a reflective layer on the second insulating layer, the reflective layer configured to reflect the light emitted by the light emitting chip,
   wherein the reflective layer overlaps the first conductive pattern and the second conductive pattern without overlapping the light emitting chip, such that the reflective layer including an opening in which the light emitting chip is disposed.

17. The backlight unit of claim 16,
   wherein the reflective layer is electrically connected to the first conductive pattern or the second conductive pattern.

18. The backlight unit of claim 16, wherein the first conductive pattern comprises a same material as the second conductive pattern.

19. The backlight unit of claim 16, further comprising an emission connecting line on the first insulating layer,
   wherein the emission connecting line includes a portion that is exposed by the second insulating layer and is connected to the light emitting chip.

20. The backlight unit of claim 16, further comprising:
   a scattering layer on the reflective layer, the scattering layer configured to scatter the light emitted by the light emitting chip,
   wherein the scattered light is reflected by the reflective layer.

* * * * *